(12) United States Patent
Ogura et al.

(10) Patent No.: US 8,581,361 B2
(45) Date of Patent: Nov. 12, 2013

(54) SEMICONDUCTOR APPARATUS

(75) Inventors: Masanori Ogura, Tokyo (JP); Hideo Kobayashi, Tokyo (JP); Yukihiro Kuroda, Kunitachi (JP)

(73) Assignee: Canon Kabushiki Kaisha, Tokyo (JP)

( * ) Notice: Subject to any disclaimer, the term of this patent is extended or adjusted under 35 U.S.C. 154(b) by 48 days.

(21) Appl. No.: 13/316,308

(22) Filed: Dec. 9, 2011

(65) Prior Publication Data

US 2012/0153367 A1   Jun. 21, 2012

(30) Foreign Application Priority Data

Dec. 20, 2010   (JP) ................ 2010-283771

(51) Int. Cl.
*H01L 29/00* (2006.01)
(52) U.S. Cl.
USPC ................. 257/503; 257/E23.169
(58) Field of Classification Search
USPC ........... 257/203, 503, E23.169, E23.178, 257/E31.113
See application file for complete search history.

(56) References Cited

U.S. PATENT DOCUMENTS 7,750,373 B2 *   7/2010   Taniguchi et al. ............ 257/203

FOREIGN PATENT DOCUMENTS

JP   2008-78354 A   4/2008

* cited by examiner

*Primary Examiner* — Quoc Hoang
(74) *Attorney, Agent, or Firm* — Canon U.S.A., Inc. IP Division

(57) ABSTRACT

A power supply wiring and a pad are arranged on a first wiring layer. Then, the power supply wiring and the pad are arranged so as not to be mutually overlapped. Signal wirings are arranged on a second wiring layer. Another signal wiring is arranged on a layer different from the second wiring layer. The other signal wiring is arranged below the pad so as to be overlapped with the pad. The signal wirings and the other signal wiring are mutually connected by a plug. A buffer is arranged between the pad and the other signal wiring.

29 Claims, 7 Drawing Sheets

SEMICONDUCTOR APPARATUS

BACKGROUND OF THE INVENTION

1. Field of the Invention

The present invention relates to a wiring technology for a semiconductor apparatus and particularly relates to a wiring technology for a solid-state image pickup apparatus.

2. Description of the Related Art

A semiconductor apparatus has an input pad to which a signal is input from an external part of a semiconductor chip and an output pad for outputting a signal to the external part.

Japanese Patent Laid-Open No. 2008-78354 discloses pads in a semiconductor apparatus and a wiring layout. The semiconductor apparatus described in FIG. 1 of Japanese Patent Laid-Open No. 2008-78354 has power supply wirings (4a and 4b) for an internal circuit arranged so as to completely surround a periphery of the internal circuit. Then, first power supply pads (8a and 8b) for the internal circuit are formed while being integrated with the power supply wiring for the internal circuit. Furthermore, second power supply pads (7a and 7b) for the internal circuit are arranged in an outer area of a chip.

In the above-described layout, the wirings intersect mutually. To be more specific, a power supply wiring for supplying a power supply voltage to the internal circuit from the second power supply pads intersects the power supply wiring for the internal circuit. For that reason, according to Japanese Patent Laid-Open No. 2008-78354, the layout is disclosed in which the wiring for supplying the power supply to the internal circuit from the second power supply pads is overlapped in a planar view with the first power supply pads.

In general, with regard to the semiconductor apparatus, the number of semiconductor chips that can be obtained from one sheet of wafer (chip yield) is set to be large. For this reason, it is demanded that devices that realize the same function and purpose are arranged in a semiconductor chip of a smallest possible area.

SUMMARY OF THE INVENTION

A semiconductor apparatus according to an aspect of the present invention includes a semiconductor chip, the semiconductor chip including: a plurality of pads including an input pad and an output pad; a first circuit section; a second circuit section; and a wiring for electrically connecting an output node of the first circuit section to an input node of the second circuit section, in which: the first circuit section and the second circuit section are arranged in an inner area of the semiconductor chip with respect to the plurality of pads; the wiring is composed of a conductive member; and at least a part of the conductive member is overlapped with at least one pad of the plurality of pads.

A semiconductor apparatus according to another aspect of the present invention includes a semiconductor chip, the semiconductor chip including: a plurality of pad including an input pad and an output pad; a circuit section; and a wiring for electrically connecting a first pad of the plurality of pads and a node of the circuit section, in which: the circuit section is arranged in an inner area of the semiconductor chip with respect to the plurality of pads; the wiring is composed of a conductive member; and a part of the conductive member is overlapped with a second pad of the plurality of pads.

Further features of the present invention will become apparent from the following description of exemplary embodiments with reference to the attached drawings.

DESCRIPTION OF THE EMBODIMENTS

Figure 1:
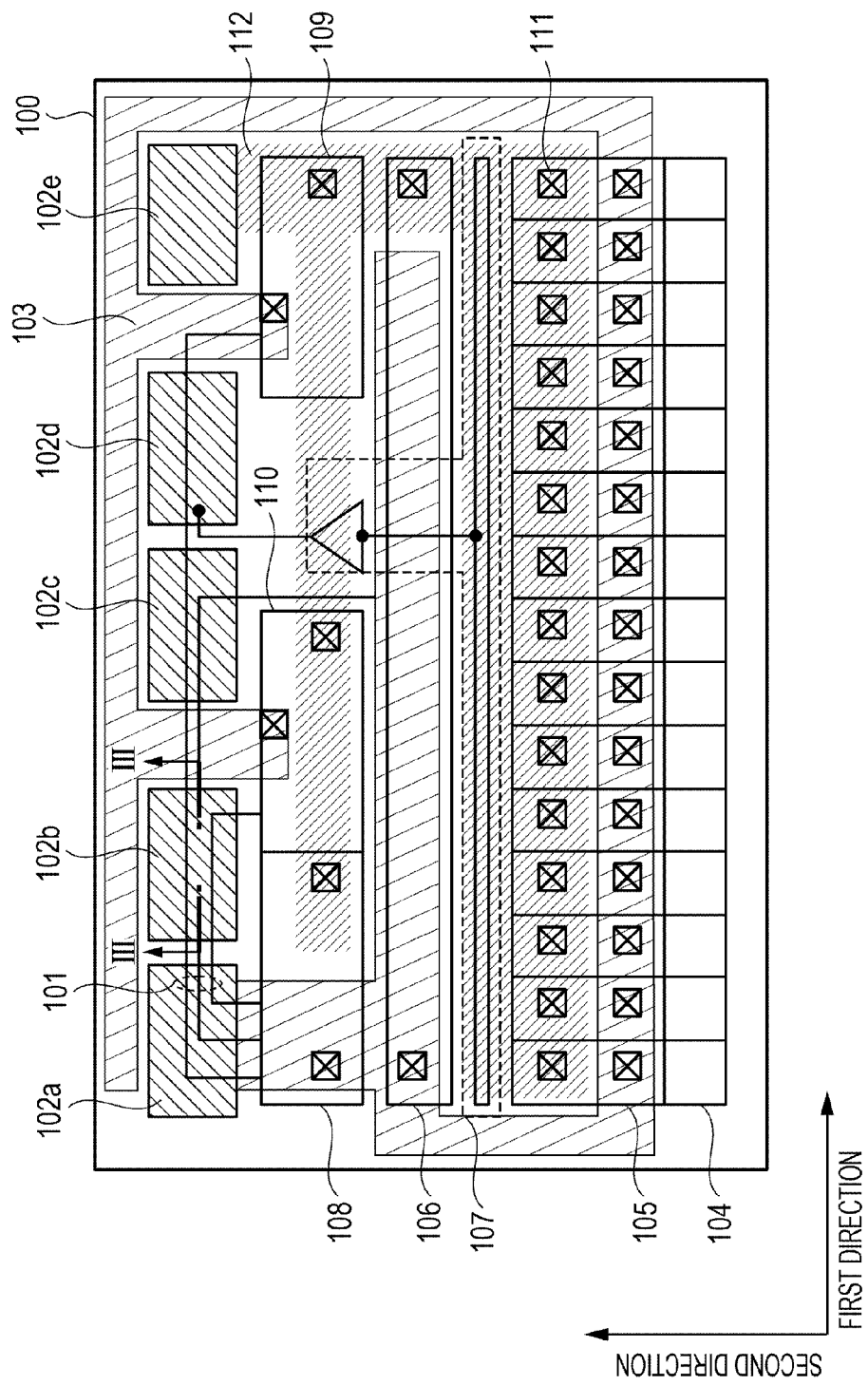
FIG. 1 is a schematic diagram of a planar layout according to a first embodiment of the present invention.

Main parts according to the present invention will be described by using FIG. 1. In FIG. 1, reference symbol 100 denotes a semiconductor apparatus. A bold line in an outermost area of the semiconductor apparatus 100 indicates an end of a semiconductor chip.

The present invention relates to the semiconductor apparatus. In the present specification, the semiconductor apparatus means a semiconductor substrate on which a device is arranged, a part in which the relevant semiconductor substrate is packaged, or an apparatus to which the relevant part is mounted. A piece that is the semiconductor substrate on which the device is arranged and is cut into a size for packaging is referred to as semiconductor chip or, simply, chip. It should be however noted that although actually not cut, a part of the semiconductor that should be cut off for the packaging is the semiconductor chip. Also, a solid-state image pickup apparatus means an apparatus used for image pickup in the semiconductor apparatus.

The semiconductor apparatus 100 according to the present invention has a plurality of pads including input pads and output pads. In FIG. 1, the pads are denoted by reference symbols 102a to 102e. Furthermore, the semiconductor apparatus 100 has a first circuit section and a second circuit section arranged in an inner area of the semiconductor chip with respect to the plurality of pads 102a to 102e. In FIG. 1, two of 104 to 110 are relevant to the first circuit section and the second circuit section. Herein, reference symbol 108 denotes the first circuit section, and reference symbol 109 denotes the second circuit section. In the present specification, the circuit sections mean areas where the circuits for realizing predetermined functions are arranged in the semiconductor chip. To be more specific, elements such as transistors constituting the relevant circuit, local wiring for mutually connecting these elements, plugs, and the like are arranged in the circuit sections.

The semiconductor apparatus 100 has wiring 101 for electrically connecting an output node of the first circuit section 108 with an input node of the second circuit section 109. A characteristic part of the present invention is a layout of conductive members constituting the wiring 101. To be more specific, it is characterized in that a part of the conductive members constituting the wiring 101 is overlapped in a planar view with one pad among the plurality of pads. Herein, a state in which the pad is overlapped in a planar view with the wiring means that the pad is overlapped with the wiring when viewed from a direction perpendicular to a main plane of the semiconductor substrate.

Figure 3:
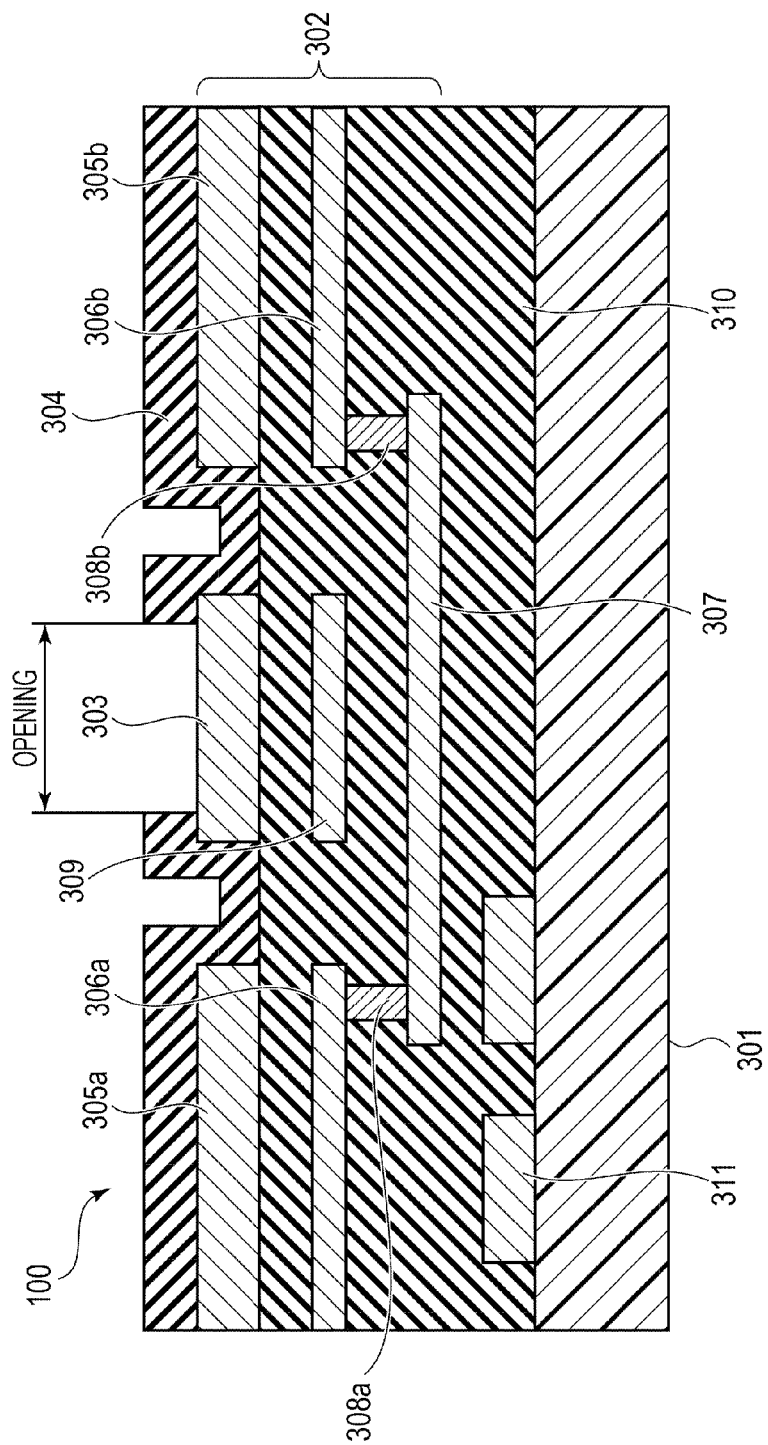
FIG. 3 is a schematic diagram of a cross section according to the first embodiment of the present invention.

FIG. 3 illustrates a conceptual diagram of a cross section of a part III-III of FIG. 1. Reference symbol 303 corresponds to the pad 102b of FIG. 1. The conductive members constituting the wiring 101 of FIG. 1 are indicated by a first conductive member 307, a second conductive member 306a, and a third conductive member 306b in FIG. 3. That is, the wiring 101 is composed by including the first conductive member 307, the second conductive member 306a, and the third conductive member 306b. The first conductive member 307 is overlapped in a planar view with the pad 303.

The pad is a conductive member for bonding wire or an inspection meter for a test to contact. For example, as illustrated in FIG. 3, a passivation film 304 has an opening at a location corresponding to the pad for the above-described contact. As a result, at least a part of the pad is exposed. The conductive member constituting the pad may be formed in an integrated manner with the conductive member constituting the wiring connected to the relevant pad.

According to the present invention, when the circuits arranged in the inner area of the semiconductor chip with respect to the pad are electrically mutually connected, the wiring for carrying out the electric connection is overlapped in a planar view with the pad. This point is a difference from the configuration according to Japanese Patent Laid-Open No. 2008-78354. According to Japanese Patent Laid-Open No. 2008-78354, the configuration is displayed in which the wirings for electrically connecting the second power supply pads arranged in the outer area of the semiconductor chip with the internal circuit are overlapped in a planar view with the first power supply pads arranged in the chip inner area of the semiconductor chip with respect to the second power supply pads. That is, Japanese Patent Laid-Open No. 2008-78354 does not disclose that the wiring for electrically mutually connecting the two circuits arranged in the inner area of the semiconductor chip with respect to the pad is overlapped with the pad.

Like the present invention, since the wiring for electrically mutually connecting the circuits arranged in the inner area of the semiconductor chip is arranged to be overlapped with the pad, it is possible to arrange the circuit in proximity to the pad. This is because it is not necessary to provide the area where only the wiring for carrying out the electric connection is arranged between the pad and the circuit. In other words, it is possible to set the space between the pad and the circuit to be small. This situation leads to the reduction in the chip area.

Next, a state in which the circuit section is arranged in the inner area of the semiconductor chip with respect to the pad will be described. In the present specification, the state in which the circuit section is arranged in the inner area with respect to the pad is determined on the basis of a positional relationship between the circuit and the pad when viewed in one direction. Of a plurality of pads arranged in the semiconductor chip, the pad overlapped in a planar with the wiring is a reference of the determination. In view of the above, the inner area will be described while taking FIG. 1 as an example.

FIG. 1 illustrates a first direction (direction along a long side of the chip) and a second direction (direction along a short side of the chip) orthogonal to the first direction. Suppose there is a virtual straight line passing through the pad 102b along the second direction. This virtual straight line contains a line segment which passes through the pad 102b, and both ends of which are intersecting points between the virtual straight line and the respective ends of the chip. A middle point of this line segment is a center of the chip. The pad 102a divides this line segment into two parts. The two parts are a part including the center of the chip and a part which does not include the center of the chip. Among these parts, the part including the center of the chip is the inner area of the semiconductor chip with respect to the pad. More strictly speaking, when this line segment is moved in parallel in the first direction (direction orthogonal to the focused direction), a trajectory of the part including the center of the chip becomes a certain area. This certain area is the inner area of the semiconductor chip with respect to the pad.

A border where the above-described line segment is divided by the pad 102b is set as the end farther from the center of the chip among both ends of the pad 102b. The pad 102b illustrated in FIG. 1 is a rectangle having one side orthogonal to the second direction. For that reason, even when the above-described line segment is moved in parallel along the first direction, the positions of the ends of the pad 102b on the relevant line segment are not changed. However, in a case where the pad has a circular shape or the like, in accordance with the positions where the line segment is moved in parallel, the positions of the ends of the pad 102b on the relevant line segment may vary. In such a case, in the focused direction, the end farthest from the center of the chip among the ends of the pad is the reference. That is, when the above-described line segment is moved in parallel in the first direction, the end of the pad on the line segment located at the position where a distance from the center of the chip to the ends of the pad becomes largest is the border.

Figure 7:
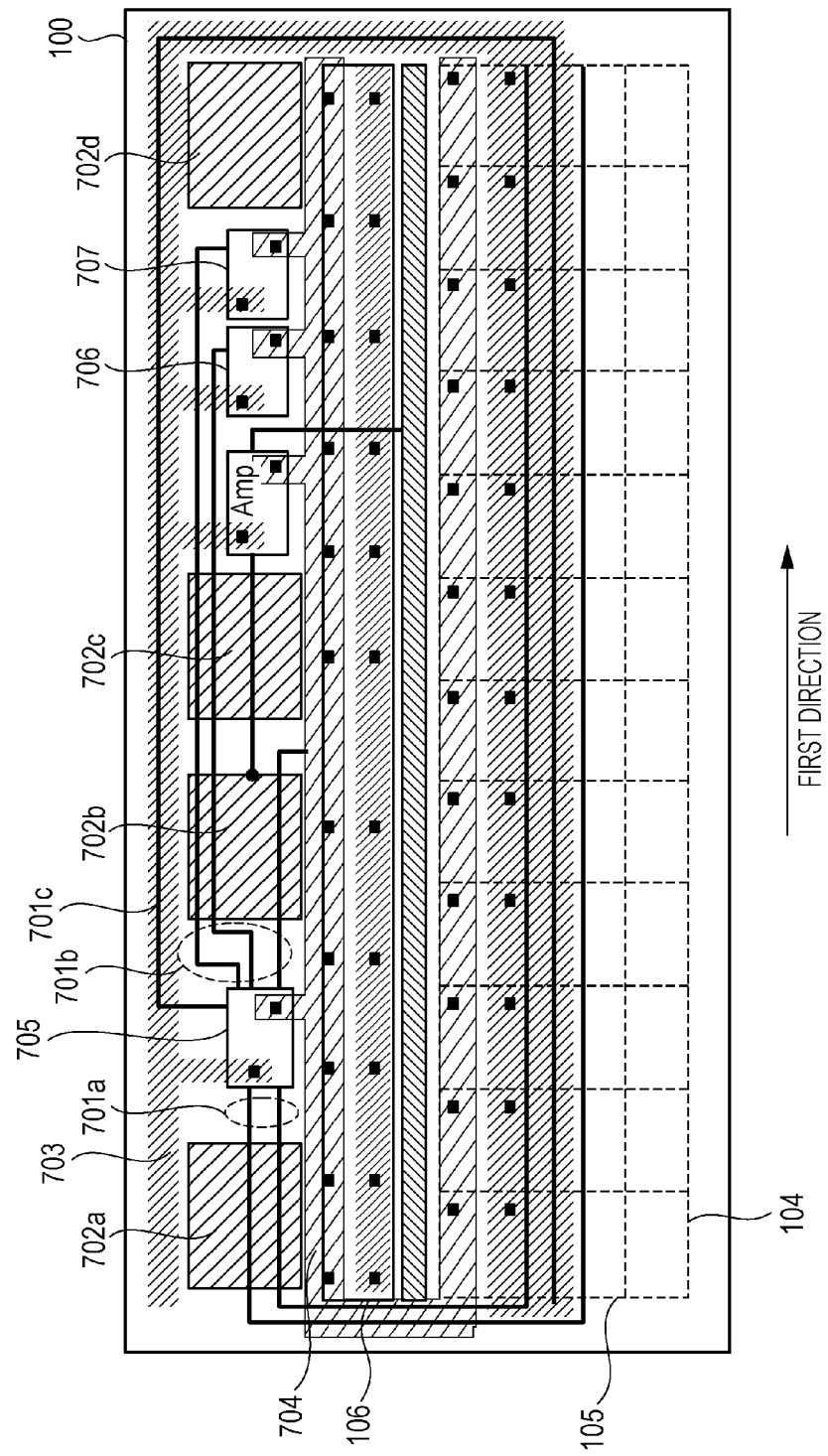
FIG. 7 is a schematic diagram of a planar layout according to a fourth embodiment of the present invention.

In addition, in the area where the pad does not exist, the ends of the pad are extended in the direction orthogonal to the focused direction (the first direction in FIG. 1) to be set as the reference. That is, a straight line that intersects the relevant line segment at the end of the pad farther from the center of the above-described line segment and is parallel to the first direction (direction perpendicular to the relevant line segment) may be the border. For example, in a case where the second direction of FIG. 1 is focused, a straight line which contains the side farther from the center of the chip among the two sides of the pad 102b parallel to the first direction may be the reference. In a case where the pad has a circular shape or the like, in the focused direction, the end furthest from the center of the chip among the ends of the pad may be the reference. Therefore, it can be mentioned that the circuit section arranged along with the plurality of pads is also arranged in the inner area of chip with respect to the pad. The above-described layout is illustrated in FIG. 7.

On the basis of the above-mentioned reference, it is determined whether the circuit section is arranged in the inner area of the chip with respect to the pad. It is noted that it is not necessary for the entire area of the circuit section to be arranged in the inner area of the chip with respect to the pad, and if at least a part of the circuit section is arranged in the inner area of the chip with respect to the pad, the effect of the present invention can be obtained.

The present invention can be applied to various uses as long as it is a semiconductor apparatus. In particular, in a case where the present invention is applied to a solid-state image pickup apparatus, the above-described effect of the reduction in the chip area is large. This point will be described.

In the solid-state image pickup apparatus, a plurality of pixels are arrange along the first direction in many cases. With regard to the length of the semiconductor chip in the first direction in the solid-state image pickup apparatus, a shortest length is decided in accordance with the number of pixels and the pixel size. It is difficult to set the length of the semiconductor chip in the first direction to be shorter than the above-described shortest length. Therefore, to reduce the chip area, the length in the second direction intersecting the first direction is set to be small. From the above-described reason, the shape of the solid-state image pickup apparatus is generally a rectangular shape in many cases. In particular, in the case of the solid-state image pickup apparatus where the number of rows is extremely smaller than the number of columns, for example, a line sensor, the shape is likely to be an extremely elongated shape.

The solid-state image pickup apparatus includes a plurality of circuits having mutually different functions in general. For an efficient layout in the chip having the rectangular shape, the plurality of circuits are arranged along the first direction. Furthermore, the wiring for electrically mutually connecting the plurality of circuits is arranged along the first direction. Also, the plurality of pads are arranged in the outer area of the semiconductor chip along the first direction. The plurality of pads are arranged on the straight line and constitute a pad array.

When the configuration of the present invention is applied in the case of the above-described configuration of the solid-state image pickup apparatus, the effect of the reduction in the chip area is high. Hereinafter, the present invention will be described in detail by way of specific embodiments. The description will be provided while the solid-state image pickup apparatus is exampled as the semiconductor apparatus, but the configuration is not limited to this as described above.

First Embodiment

Hereinafter, embodiments of the solid-state image pickup apparatus according to the present invention will be described with reference to the drawings. First, a planar layout according to the present embodiment will be described. Next, a cross sectional structure of the wiring section according to the present embodiment will be described.

First, a description will be given of a planar layout of a pad, a conductive member constituting a power supply wiring, a conductive member constituting a signal wiring, and a circuit such as a signal processing circuit. Herein, the description will be given while a line sensor is taken as an example. A circuit configuration may be common for all the following embodiments.

FIG. 1 is a schematic block diagram of a line sensor to which the present invention may be applied. To be more specific, the signal wiring 101, the plurality of pads 102a to 102e, a power supply wiring pattern 103, a GND wiring pattern 112, and a plurality of circuit sections are illustrated. The plurality of circuits distinguished for each function are respectively arranged in corresponding circuit sections. The plurality of circuits include a pixel 104 including a photoelectric conversion section, a readout circuit 105, a main scanning circuit 106, an output circuit 107, a timing generator (hereinafter, which will be referred to as TG) 108, a control circuit 109, and another circuit 110. Functions of these circuits will be described below.

In FIG. 1, the signal wiring 101 is indicated by a straight line. However, in actuality, similarly, like the power supply wiring pattern 103 and the GND wiring pattern 112, the signal wiring 101 is composed of a conductive member having a certain width. Then, a position of the signal wiring 101 illustrated in the drawing schematically indicates a position where the conductive member is actually arranged. Of course, the signal wiring 101 also includes a meaning as a symbol on the circuit diagram indicating that an electric connection is established between the two nodes. It is noted that to be distinguished from the power supply wiring and the GND wiring, "the wiring 101" in the previous description will be referred to as "the signal wiring 101" for convenience.

The signal wiring 101 electrically connects the plurality of circuits mutually. In FIG. 1, the signal wiring for electrically connecting the TG 108 to the main scanning circuit 106, the signal wiring for electrically connecting the TG 108 to the control circuit 109, and the signal wiring for electrically connecting the TG 108 to the other circuit 110 are illustrated. However, in actuality, still more signal wirings may be arranged. The pads 102a to 102e include the power supply pad 102a for supplying a power supply voltage and the GND pad 102e for supplying a GND voltage. The power supply wiring composed of the power supply wiring pattern 103 supplies the power supply voltage from the power supply pad 102a to the respective circuits. The GND wiring composed of the GND wiring pattern 112 supplies the GND voltage from the GND pad 102e to the respective circuits. Reference symbol 111 denotes a plug for connecting the power supply wiring pattern 103 or the GND wiring pattern 112 to elements constituting the respective circuits. Also, the plurality of pads 102a to 102e include the signal pad 102d for transmitting a signal. Via the signal pad 102d, for example, a signal from a pixel is output to an external unit of the solid-state image pickup apparatus.

The line sensor according to the present embodiment includes the plurality of pixels 104. The plurality of pixels 104 are arranged along the first direction. The long side direction of the chip in FIG. 1 is the first direction. In FIG. 1, the plurality of pixels 104 are arranged in a line fashion. However, in actuality, the plurality of pixels 104 may be arranged in a plurality of lines. That is, the plurality of pixels 104 may be arranged in a matrix manner. In this manner, the plurality of pixels 104 constitute a pixel array along the first direction.

The plurality of pads 102a to 102e are arranged along the first direction that is the same direction in which the plurality of pixels 104 are arranged. As a result, the plurality of pads 102a to 102e constitute a pad array along the first direction. As illustrated in FIG. 1, the pad array is arranged in parallel to the pixel array constituted by the plurality of pixels 104.

The signal wiring 101 is arranged along the first direction that is the parallel direction to the direction of the pixel array. Of course, the signal wiring 101 may have a part along a direction other than the first direction. Furthermore, the conductive member constituting the signal wiring 101 includes a part overlapped in a planar view with the pads 102a to 102d. That is, the signal wiring 101 is overlapped in a planar view with at least one pad of the plurality of pads 102a to 102d. A cross sectional structure of the part where the conductive member constituting the signal wiring 101 is overlapped with the pad 102b will be described.

According to the present embodiment, the TG 108 and the control circuit 109 are arranged between the pad array and the pixel array along the first direction. To electrically connect above-described two circuits to each other, the signal wiring 101 is arranged along the first direction as a whole. However, the other circuit 110 may be arranged between the TG 108 and the control circuit 109. In the circuit section where the other circuit 110 is arranged, local wirings for mutually connecting the plurality of elements constituting the other circuit 110 are arranged. In the above-described case, the conductive member constituting the signal wiring 101 for electrically connecting the TG 108 to the control circuit 109 is arranged while bypassing these local wirings in many cases. Also, if the conductive member constituting the signal wiring 101 is arranged in another circuit section, cross talk may be generated between the signal wiring 101 and the local wiring. For that reason, countermeasures such as an arrangement of a shield wiring are applied, and the number of wiring layers tends to be increased. According to the aspect of the present invention, the above-described cross talk is suppressed, and the increase in the number of wiring layers can be avoided.

Also, the main scanning circuit 106 is arranged between the pad array and the pixel array. The length in the first direction of the circuit section where the main scanning circuit 106 is arranged is longer than the length in the first direction of the circuit section where the TG 108 is arranged. In addition, a plurality of nodes of the main scanning circuit 106 are connected to the TG 108. The plurality of nodes may be arranged along the first direction while corresponding to the plurality of pixels 104. In the above-described case, to connect the TG 108 to these nodes, the signal wiring 101 is arranged along the first direction as a whole. In FIG. 1, with only one signal wiring 101, the TG 108 and the main scanning circuit 106 are connected to each other. However, to connect the above-mentioned plurality of nodes to the TG 108, the plurality of signal wirings 101 may be arranged.

According to the present embodiment, the power supply wiring pattern 103 or the GND wiring pattern 112 is arranged while bypassing the pads 102*a* to 102*e*. That is, the power supply wiring pattern 103 or the GND wiring pattern 112 is arranged so as not to be overlapped in a planar view with any of the plurality of pads 102*a* to 102*e*.

Figure 2:
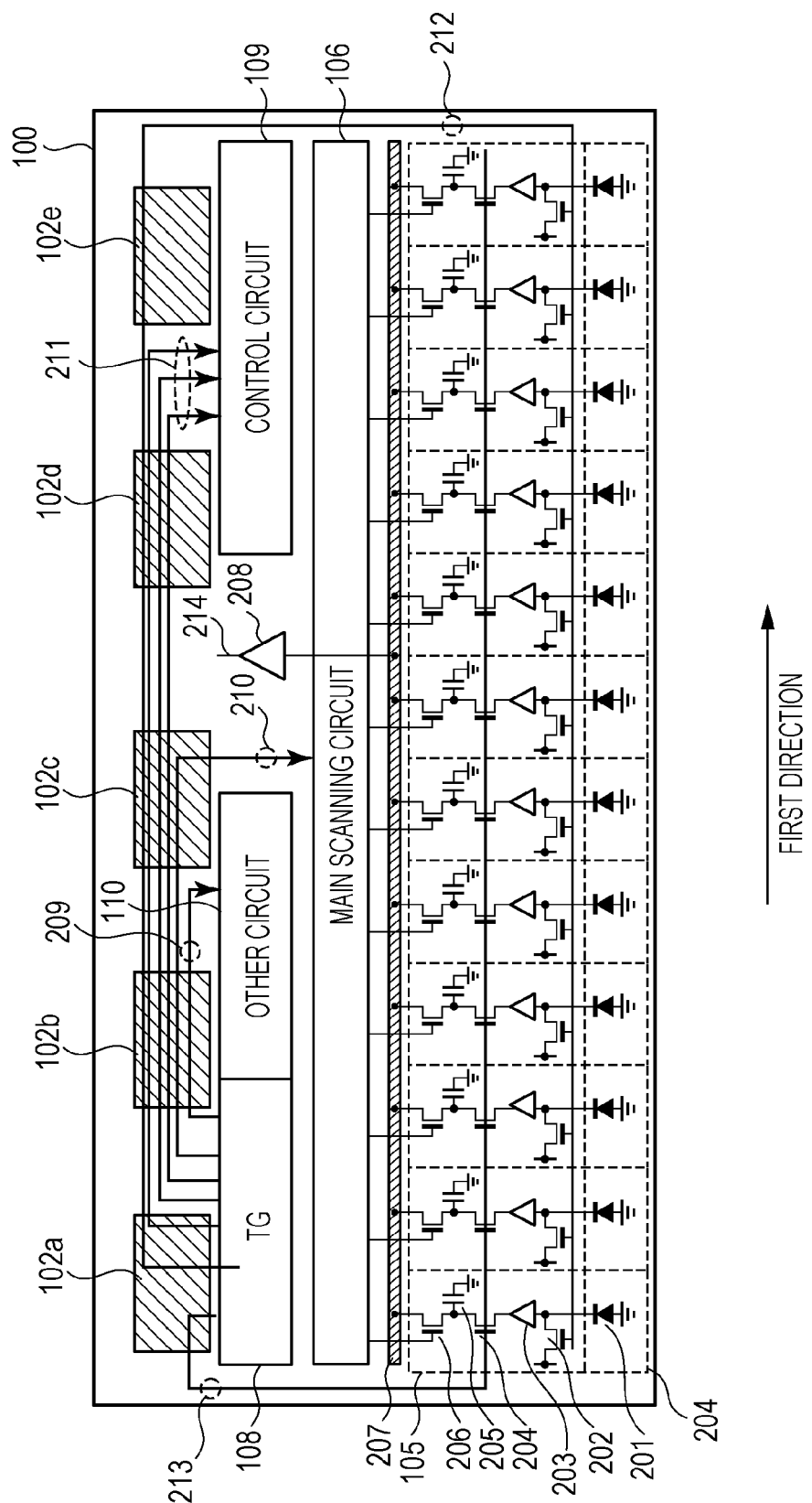
FIG. 2 illustrates a circuit configuration according to the first embodiment of the present invention.

Next, the signal wiring and the power supply wiring will be described. If not otherwise specified, the description on the power supply wiring can be applied to the GND wiring. First, the circuit configuration according to the present embodiment will be described in detail. FIG. 2 is a schematic diagram illustrating a circuit configuration of the line sensor according to the present embodiment. Parts having a function similar to FIG. 1 are assigned with the same reference symbols. To describe the circuit configuration in more detail, FIG. 2 is different from FIG. 1 in the following points. First, the power supply wiring and the GND wiring are omitted. Second, specific circuit diagrams of the pixel 104 and the readout circuit 105 are illustrated. Third, the plurality of signal wirings for establishing a connection between the circuits are illustrated.

Reference symbol 201 denotes a photoelectric conversion section constituting the pixel 104. The photoelectric conversion section 201 is, for example, a photo diode. According to the present embodiment, the plurality of pixels 104 are arranged in a line fashion. An optical signal in accordance with the amount of light incident to the photoelectric conversion section 201 is read out from the pixel 104. The readout circuit 105 is a circuit for reading out the optical signal. One of the plurality of readout circuits 105 is arranged while corresponding to the respective pixels 104. The readout circuit 105 may includes a reset transistor 202, an amplifier 203, a first switch 204, a line memory 205, and a second switch 206. The reset transistor 202 resets the photoelectric conversion section 201. The amplifier 203 amplifies the optical signal to be output. The first switch 204 is a transistor for transmitting an output from the amplifier 203 to the line memory 205. The line memory 205 is a capacity for holding a signal from pixel. The second switch 206 is a transistor for transmitting the optical signal held in the line memory 205 to a subsequent stage.

A common output line 207 is arranged in a stage subsequent to the readout circuit 105. The plurality of line memories 205 are electrically connected to the common output line 207 via the corresponding second switches 206. The main scanning circuit 106 controls on and off of the plurality of second switches 206. By the control of the main scanning circuit 106, the optical signals from the plurality of pixels 104 may be sequentially read out to the common output line 207. An output amplifier 208 is arranged in a stage subsequent to the common output line 207. The output amplifier 208 amplifiers the optical signal read out to the common output line 207 to be output. According to the present embodiment, the common output line 207 and the output amplifier 208 constitute the output circuit 107. The TG 108 outputs a clock signal for regulating an operation of a circuit block. The control circuit 109 is a circuit that performs a control for a drive of the line sensor.

According to the present embodiment, the pixel 104, the readout circuit 105, and the output circuit 107 are analog circuits. The main scanning circuit 106, the TG 108, the control circuit 109, and the other circuit 110 are digital circuits. These circuit blocks are circuits used to perform a processing on the optical signal. That is, these circuits are all included in the signal processing circuit. Also, the signal processing circuit may also include analog digital conversion circuit for converting an analog signal to a digital signal (hereinafter, which will be described as ADC).

In FIG. 2, instead of the signal wiring 101 of FIG. 1, a plurality of signal wirings 209 to 214 are illustrated. The signal wiring 209 electrically connects the TG 108 to the other circuit 110. The signal wiring 210 electrically connects the TG 108 to the main scanning circuit 106. The signal wiring 211 electrically connects the TG 108 to the control circuit 109. The signal wiring 212 electrically connects the TG 108 to a gate of the reset switch 202. The signal wiring 213 electrically connects the TG 108 to a gate of the first switch 204. In actuality, still more signal wirings may be arranged. The signal wirings 209 to 213 transmit, for example, the clock signal output from the TG 108.

The signal wiring and the power supply wiring will be first described from a functional viewpoint. The signal wiring is wiring for transmitting a control signal for controlling operations of the respective circuits or transmitting a signal from a pixel. The control signal may include the clock signal and a signal for controlling on and off of the switch. The power supply wiring is wiring for supplying power supply voltages to the respective block circuits. Subsequently, the signal wiring and the power supply wiring will be described from a viewpoint of a circuit connection and a viewpoint of the supplied voltage.

First, the signal wiring will be described first from the viewpoint of the circuit connection. The reset transistor 202 and the first switch 204 are switches included in the analog circuit. Although not illustrated in the drawing, a switch may be included in the digital circuit. The wiring connected to the gate of these transistors functioning as the switch may be included in the signal wiring. As circumstances demand, an inverter circuit, a buffer circuit, or the like may be inserted in a path of the signal wiring.

From the viewpoint of the voltage supplied to the signal wiring, the signal wiring may be supplied with two-valued voltages. The two-valued voltages are, for example, a voltage for turning the switch on and a voltage for turning the switch off. Also, the wiring for transmitting the analog signal may be supplied with voltages more than two values. Therefore, the wiring for transmitting the analog signal may also be included in the signal wiring. For example, the signal from the pixel is an analog signal. In addition, the wiring for transmitting the digital signal may also be included in the signal wiring. It should be however noted that the solid-state image pickup apparatus may be set in a plurality of operation modes. In a certain operation mode, in a case where a certain switch is regularly turned on, a fixed voltage may be supplied to the signal wiring.

Next, the circuit connection of the power supply wiring will be described. The analog circuit may include an amplification circuit for amplifying the signal. For example, the readout circuit 105 includes the amplifier 203. The output circuit 107 includes the output amplifier 208. The amplification circuit is specifically a source follower circuit, a source ground circuit, a differential amplification circuit, or the like. Also, a comparator included in the ADC is an amplification circuit. The wiring electrically connected to the power supply voltage supply node of these amplification circuits may be included in the power supply wiring. Also, the wiring electrically connected to the GND voltage supply node of these amplification circuits may be included in the GND wiring. On the other hand, although not illustrated in the drawing, the digital circuit includes an inverter constituting a logic gate. For example, a CMOS inverter or the like is included in the digital circuit. The wiring electrically connected to the power supply voltage supply node of the node may be included in the power supply wiring. Also, the wiring electrically connected to the GND voltage supply node of the inverter may be included in the power supply wiring. The power supply voltage supply node and the GND voltage supply node are both referred to as power supply node. If necessary a switch for controlling a continuity of the power supply wiring may be inserted in a path of the power supply wiring.

Furthermore, in accordance with an operation of the solid-state image pickup apparatus, a voltage other than the power supply voltage and the GND voltage is supplied to the power supply wiring in some cases. Even in this case, the wiring connected to the power supply voltage supply node may be included in the power supply wiring. Also, it is conceivable that a voltage that should be fixed fluctuates because of noise or the like.

Subsequently, the cross sectional structure of the part where the signal wiring 101 is overlapped with the pad 102b will be described. FIG. 3 is a schematic diagram of a cross section of a wiring section of the solid-state image pickup apparatus according to the first embodiment of the present invention. FIG. 3 illustrates a cross section taken along the straight line III-III of FIG. 1.

The semiconductor apparatus 100 according to the present embodiment includes a semiconductor substrate 301 and a multilayer wiring section 302 arranged on the semiconductor substrate 301. The semiconductor substrate 301 is, for example, a silicon substrate. Herein, a planar face is a face in parallel to a main face of the semiconductor substrate 301. A cross-sectional face is a face including a direction perpendicular to the main face of the semiconductor substrate 301. The main face of the semiconductor substrate 301 is defined as a boundary face between a semiconductor area and an insulating film arranged on the semiconductor area. For example, a boundary face between the semiconductor area in a channel of the transistor and a gate oxide film is a main face. In the case of the solid-state image pickup apparatus, a boundary face between the semiconductor area of the photoelectric conversion section and the oxide film is a main face.

The multilayer wiring section 302 includes a plurality of wiring layers having different heights from the main face of the semiconductor substrate 301. On the respective wiring layers, the conductive member constituting the wiring is arranged at a predetermined position. The wiring is formed, for example, of a metal such as aluminum or copper. The conductive members arranged in different wiring layers may be mutually connected via plugs. Interlayer insulating films are respectively arranged between the wiring layer and the wiring layer and between the wiring layer and the semiconductor substrate 301.

In FIG. 3, reference symbol 303 denotes a pad. Input and output of a signal between the semiconductor apparatus 100 and the external part may be carried out via the pad 303. Also, the power supply voltage and the GND voltage to the semiconductor apparatus 100 may be supplied via the pad 303. According to the present embodiment, the pad 303 is formed on a first wiring layer which is an uppermost layer. Reference symbol 304 denotes a passivation film composed of an insulator. The passivation film 304 has an opening at a position corresponding to the pad 303. Through the opening arranged in the passivation film 304, bonding wire or the like for establishing a connection to the external part is connected to the pad 303.

Reference symbols 305a and 305b denote conductive members constituting the power supply wiring (hereinafter, which will be referred to as power supply wiring members). According to the present embodiment, the power supply wiring members 305a and 305b are formed by the first wiring layer which is the uppermost layer. That is, the pad 303 and the power supply wiring members 305a and 305b are arranged on the same wiring layer. In FIG. 3, the power supply wiring members 305a and 305b illustrated as two separated parts are the electrically same node. According to the present embodiment, the power supply wiring members 305a and 305b are formed on one wiring layer. It should be however noted that in a location where the power supply wiring is connected to the respective circuits, the power supply wiring member 305 may be electrically connected to the conductive member on another layer via the plug.

Reference symbols 307, 306a, and 306b respectively denote the first conductive member, the second conductive member, and the third conductive member constituting the signal wiring. The second conductive member 306a and the third conductive member 306b are arranged on the second wiring layer. The first conductive member 307 is arranged on a layer different from the second wiring layer. According to the present embodiment, the first conductive member 307 is arranged on a third wiring layer. The first conductive member 307 is arranged so as to be overlapped in a planar view with the pad 303 below the pad 303. Reference symbols 308a and 308b denote plugs. The plugs 308a and 308b are formed of a conductive material such as tungsten. According to the present embodiment, the second conductive member 306a and the first conductive member 307 are electrically connected to each other by the plug 308a. Also, the third conductive member 306b and the first conductive member 307 are electrically connected to each other by the plug 308b.

Reference symbol 310 denotes an interlayer insulating film. The interlayer insulating film is formed, for example, of an insulating material such as a silicon oxide film or a silicon nitride film. Reference symbol 311 denotes a polysilicon electrode. The polysilicon electrode 311 is arranged on the semiconductor substrate 301 via an insulating film.

In FIG. 3, reference symbol 309 denotes a buffer. The buffer 309 is provided if necessary. The buffer 309 is arranged on an intermediate layer between the pad 303 and the first conductive member 307. The buffer 309 is overlapped in a planar view with the pad 303 and the signal wiring pattern 307. That is, when the cross section is viewed, the pad 303, the buffer 309, and the first conductive member 307 are stacked. The buffer 309 may be formed of the same conductive member as the wiring. With the buffer 309, braking of the signal wiring pattern 307 becomes unlikely to occur.

Furthermore, an elastic coefficient of the buffer 309 may be higher than an elastic coefficient of the interlayer insulating film 310. The elastic coefficient is an index representing a strength of stress used for a certain deformation volume. An effect from the high elastic coefficient will be briefly described. When the bonding wire is connected to the pad 303, stress is applied to the pad 303 and a lower part thereof. When this stress is transmitted to the wiring below the pad 303, braking may occur in the wiring. Since the elastic coefficient of the buffer 309 is higher than the elastic coefficient of the interlayer insulating film 310, the buffer 309 alleviates the stress. As a result, braking in the signal wiring pattern 307 arranged below the pad 303 becomes unlikely to occur.

Also, according to the present embodiment, the buffer 309 may be electrically floating. A benefit from the state in which the buffer 309 is electrically floating will be briefly described. When the bonding wire is connected to the pad 303, a crack may develop in the interlayer insulating film 310 below the pad 303. The crack may develop and extend from the pad 303 up to the buffer 309. If moisture infiltrates into an area where the above-described crack has developed, the pad 303 and the buffer 309 arranged below the pad 303 may short out. If the buffer 309 is electrically floating, even if the pad 303 and the buffer 309 short out, no influence is imparted on the other circuits.

Herein, a correspondence relationship between FIG. 1 and FIG. 3 will be described. FIG. 3 illustrates the cross section along the straight line of FIG. 1. The pad 102b of FIG. 1 corresponds to the pad 303 of FIG. 3. The power supply wiring pattern 103 of FIG. 1 corresponds to the power supply wiring members 305a and 305b of FIG. 3. The signal wiring 101 of FIG. 1 corresponds to the first conductive member 307, the second conductive member 306a, the third conductive member 306b, and the plug 308 of FIG. 3.

The part overlapped with the pad 102b in the signal wiring 101 corresponds to the first conductive member 307 of FIG. 3. As illustrated in FIG. 3, the part overlapped with the pad 102b of the signal wiring 101 (the first conductive member 307 of FIG. 3) is arranged in a layer different from a part which is not overlapped with any of the pads 102a to 102e of the signal wiring 101 (the second conductive member 306a and the third conductive member 306b of FIG. 3).

As described above, according to the present embodiment, for example, in FIG. 1, it is possible to reduce the area between the plurality of pads 102a to 102e and the plurality of circuits. That is, it is possible to decrease the length in the direction orthogonal to the first direction of the semiconductor chip. Therefore, it is possible to reduce the chip area.

Figure 4:
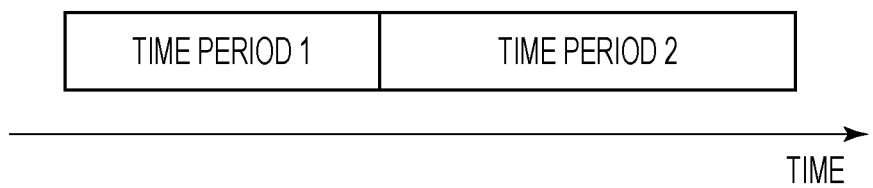
FIG. 4 is a pattern diagram illustrating an operation timing of a line sensor according to the present invention.

FIG. 4 is a schematic diagram illustrating an operational timing of the solid-state image pickup apparatus according to the present embodiment. In a time period 1, the optical signals from the plurality of respective pixels 104 are read out to the corresponding line memories 205 at the same time. In the time period 1, clock signals are supplied to the signal wirings 212 and 213. These clock signals control the reset transistor 202 and the first switch 204. In a time period 2, the plurality of optical signals held in the line memory 205 are sequentially read out to the common output line 207. Then, the optical signal is output from the output amplifier 208. In the time period 2, the main scanning circuit 106 controls the second switch 206 on the basis of the clock signal supplied to the signal wiring 210.

The optical signal output from the output circuit 107 is output to the external unit via the signal pad 102d. In this period, the clock signals are not supplied to the signal wirings 212 and 213 related to the time period 1. That is, between the signal supplied to the pad for outputting the optical signal and the signals supplied to the signal wirings 212 and 213, timings at which the voltages are changed are mutually different. Therefore, in a case where the signal pad for outputting the optical signal is overlapped with the signal wiring 212 and 213, the influence of the cross talk is small. In this manner, while the pad and the signal wiring to which the signals are supplied at different timings are mutually overlapped and arranged, the influence of the cross talk can be suppressed.

Also, according to the present embodiment, the signal processing circuit is arranged between the pixel array and the plurality of pads. According to the above-described configuration, the signal processing circuit is not arranged between the pad and the pad. Therefore, the sizes of the respective pad can be increased.

Also, according to the present embodiment, the conductive member constituting the power supply wiring is arranged on the same wiring layer as the pad. Then, the conductive member constituting the power supply wiring is arranged so as not be overlapped with the pad. Therefore, the conductive member constituting the power supply wiring does not need to be connected to the conductive member arranged on a lower layer of the wiring layers via the plug. For that reason, it is possible to reduce the number of contacts between the plugs and the conductive members in the path of the power supply wiring. As a result, since the contact resistance between the plugs and the conductive members can be reduced, with the configuration according to the present embodiment, it is possible to suppress the increase in the resistance of the power supply wiring.

According to the present embodiment, the signal wiring is not arranged in the wiring layer where the power supply wiring is arranged. For that reason, the degree of freedom in the layout of the power supply wiring is high. According to the above-described configuration, it is possible to increase the planar width of the power supply wiring. Therefore, it is possible to further suppress the resistance of the power supply wiring. However, in the present invention, the signal wiring may be arranged on the same uppermost layer of the wiring layers as the power supply wiring.

Also, as illustrated in FIG. 1, according to the present embodiment, the second conductive member 306a, the third conductive member 306b, and the buffer 309 are arranged on the same wiring layers. According to the above-described configuration, it is possible to simultaneously form the second conductive member 306a and the third conductive member 306b as well as the buffer 309. To be more specific, the pattern for the second conductive member 306a and the third conductive member 306b and the pattern for the buffer 309 are formed by performing a mask pattern transfer once. Therefore, without increasing the manufacturing processes, it is possible to obtain the effect of the present invention. It is noted that the buffer and the part that is not overlapped with the pad of the signal wiring may be arranged in different wiring layers.

In FIG. 3, the first conductive member 307, the second conductive member 306a, and the third conductive member 306b are electrically connected to each other outside the area where the pad 303 is arranged. The connection parts of the first conductive member 307, the second conductive member 306a, and the third conductive member 306b, that is, the plugs 308a and 308b may be arranged inside the area where the pad 303 is arranged. Also, the area where the stress is applied in the pad 303 varies depending on a wire diameter or a bonding process. For example, it is conceivable that the stress is applied only on the area corresponding to the opening arranged in the passivation film 304 of FIG. 3. In this case, the buffer 309 may be arranged only in a lower part of the area where the stress is applied.

Second Embodiment

Figure 5:
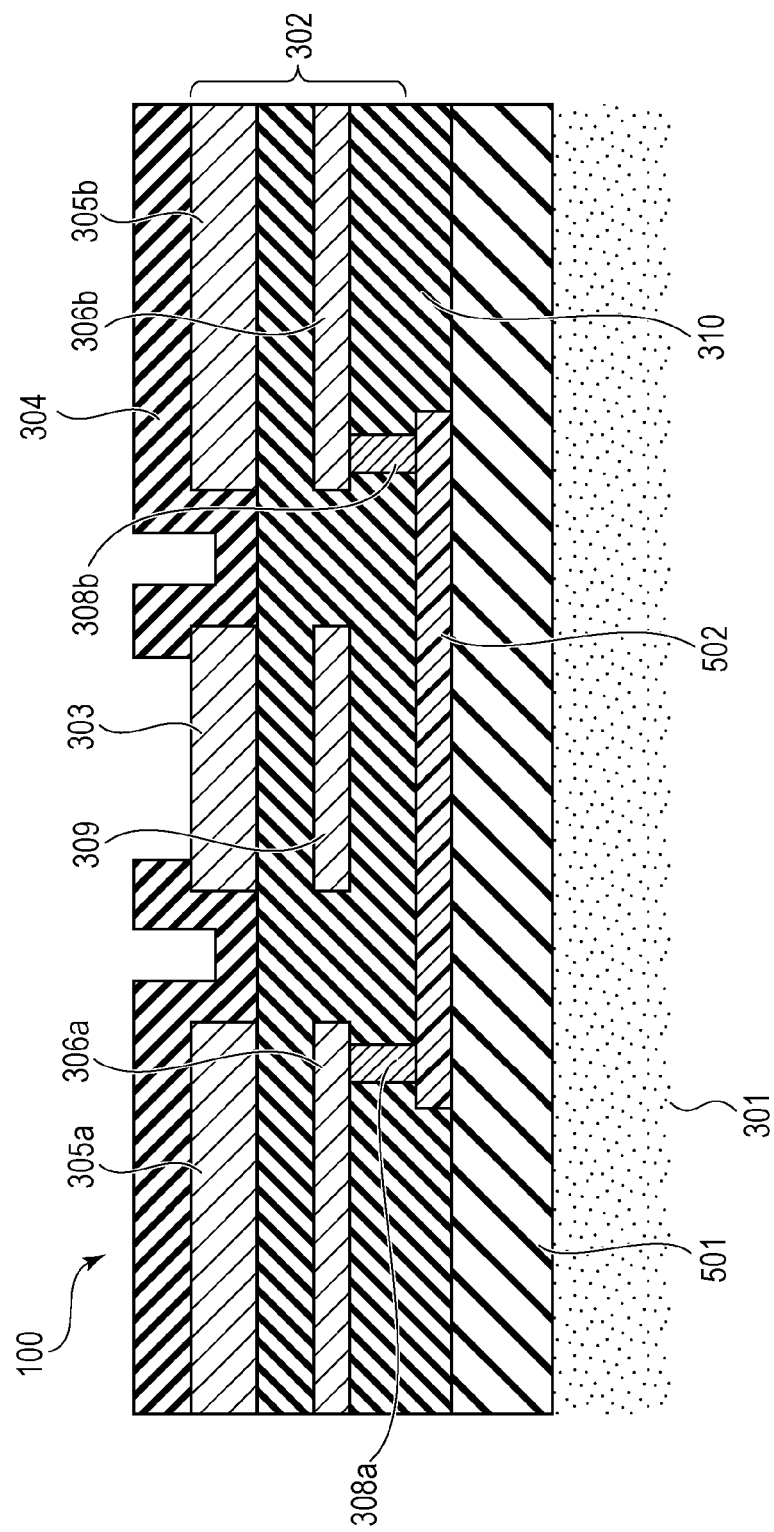
FIG. 5 is a schematic diagram of a cross section according to a second embodiment of the present invention.

FIG. 5 is a schematic diagram of the cross section of the wiring section of the solid-state image pickup apparatus according to a second embodiment of the present invention. Parts having functions similar to FIG. 1 are assigned with the same reference symbols, and a detailed description thereof will be omitted. A characteristic of the present embodiment resides in that the part overlapped with the pad of the conductive member constituting the signal wiring is formed by the same wiring layer as the gate electrode of the MOS transistor. Except for a part which will be described below, the present embodiment may have a configuration similar to the first embodiment.

In FIG. 5, an element separation film 501 is illustrated. The element separation film 501 is an oxide film arranged on the semiconductor substrate 301. For example, the element separation film 501 may be a field oxide film or an STI (Shallow Trench Isolation).

Reference symbol 502 denotes a conductive member that constitutes the signal wiring. According to the present embodiment, the conductive member 502 is formed of polysilicon. The conductive member 502 is arranged via the element separation film 501 on the semiconductor substrate 301. A MOS transistor which is not illustrated in the drawing is arranged on the semiconductor substrate 301. According to the present embodiment, the conductive member 502 is arranged on a same wiring layer as a gate electrode of the MOS transistor. In a case where the MOS transistor is arranged, since a wiring layer for forming the gate electrode is used, an additional wiring layer for arranging the conductive member 502 is not needed. According to this, even in a case where the buffer 309 is arranged on an intermediate layer between the pad and the conductive member 502 constituting the signal wiring, the number of wiring layers is not increased.

Also, the material for forming the conductive member 502 may be the same as the material for forming the gate electrode of the MOS transistor. In this case, the signal wiring pattern 502 and the gate electrode of the MOS transistor may be formed at the same time. In a case where the gate electrode of the MOS transistor is formed of a material other than polysilicon, the material for forming the signal wiring pattern 502 is not limited to polysilicon. Also, the signal wiring pattern 502 may be polysilicon subjected to silicidization.

The solid-state image pickup apparatus according to the present embodiment can reduce the number of wiring layers in addition to the effect of the first embodiment. If the number of wiring layers is small, a lower profile of the wiring can be realized. Alternatively, if the number of wiring layers is small, it is possible to simplify the manufacturing processes.

Third Embodiment

Figure 6:
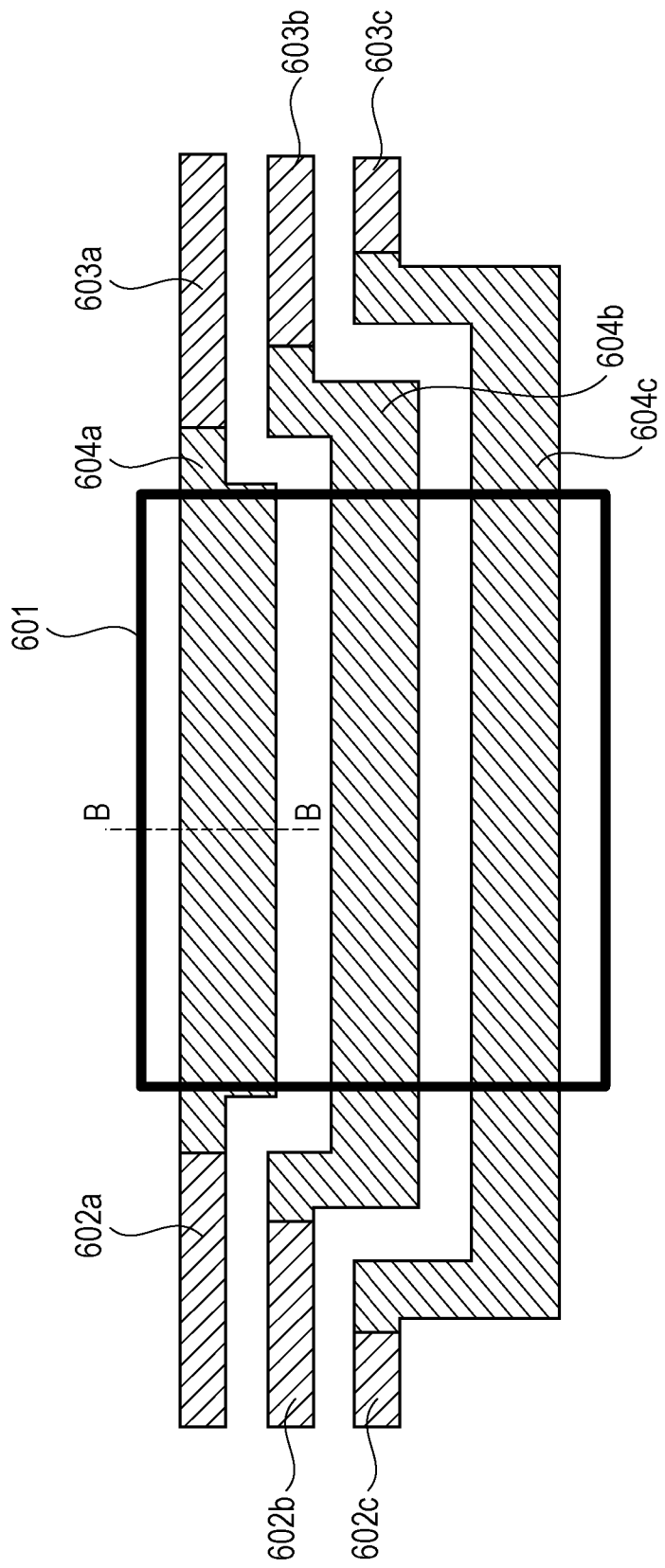
FIG. 6 is a schematic diagram of a planar layout of wiring according to a third embodiment of the present invention.

FIG. 6 is a planar schematic diagram of the wiring section of the solid-state image pickup apparatus according to a third embodiment of the present invention. According to the present embodiment, a characteristic resides in that a width at a part overlapped with the pad of the signal wiring pattern is larger than a width at a part that is not overlapped with the pad of the signal wiring pattern. Except for a part which will be described below, the present embodiment may have a configuration similar to the first embodiment or the second embodiment.

Reference symbol 601 denotes a pad. Reference symbols 602a to 602c, 603a to 604c, and 604a to 604c denote conductive members that constitute the signal wirings. Addition of different suffixes to the reference symbol of the same number means conductive members constituting the signal wirings which transmit different signals. Herein, the conductive members 602a to 602c correspond to the second conductive member 306a of FIG. 3. The conductive members 603a to 603c correspond to the third conductive member 306b of FIG. 3. The conductive members 604a to 604c correspond to the first conductive member 307 of FIG. 3 or the conductive member 502 of FIG. 5. Hereinafter, if not otherwise specified, the description of the conductive members 602a, 603a, and 604a can be applied to the conductive members 602b, 603b, 604b, 602c, 603c, and 604c.

The conductive member 602a and the conductive member 603a are arranged on the same wiring layer. Then, the conductive member 604a is arranged on the wiring layer different from the conductive members 602a and 603a. The conductive member 602a may be connected to the conductive member 604a by a plug which is not illustrated in the drawing. Similarly, the conductive member 603a may be connected to the conductive member 604a by a plug which is not illustrated in the drawing.

As illustrated in FIG. 6, the conductive member 604a constituting the signal wiring is overlapped in a planar view with the pad 601. Then, the conductive member 604a has a part having a width larger than the conductive member 602a or the conductive member 603a. According to the present embodiment, the part overlapped with the pad 601 is larger than a width of the conductive member 602a or the conductive member 603a. A width of the conductive member 604a is defined as a length along a direction perpendicular to the direction in which the signal is transmitted. For example, in the conductive member 604a, the signal is transmitted in the direction from the conductive member 602a toward the conductive member 603a. Therefore, a length along the direction indicated by the straight line BB in FIG. 6 is the width of the conductive member 604a.

As described above, according to the present embodiment, it is possible to decrease the resistance of the signal wiring in addition to the effects of the first and second embodiments. When the resistance of the signal wiring is low, for example, it is possible to realize the higher speed of the clock signals. Also, in a case where the conductive member 604a is formed of a material having a higher resistivity than the conductive members 602a and 603a, the effect of the present embodiment become more prominent. For example, in a case where the conductive members 602a and 603a are formed of aluminum or copper and the conductive member 604a is formed of polysilicon, the effect of the present embodiment become prominent.

Fourth Embodiment

FIG. 7 is a schematic diagram of a planar layout of the solid-state image pickup apparatus according to a fourth embodiment of the present invention. Parts having functions similar to FIG. 1 are assigned with the same reference symbols, and a detailed description thereof will be omitted. According to the present embodiment, a characteristic resides in that the signal processing circuit is arranged between the plurality of pads. Except for a part which will be described below, the present embodiment may have a configuration similar to the first embodiment to the third embodiment.

According to the present embodiment, a plurality of pads 702a to 702d are arranged along the same direction as the first direction that is the pixel array direction. A power supply wiring 703 is electrically connected to the power supply pad 702d. A GND wiring 704 is electrically connected to the GND pad 702a. The signal pad 702b is electrically connected to an output node of the amplification circuit (Amp). A signal output from the amplification circuit (Amp) is output via the signal pad 702b.

As illustrated in FIG. 7, according to the present embodiment, the plurality of circuits are arranged in a direction parallel to the pixel array direction. Herein, a TG 705 is arranged between the pad 702a and the pad 702b. A control circuit 706 and another circuit 707 are arranged between the pad 702c and the pad 702d. In this manner, according to the present embodiment, the plurality of pads and the plurality of circuit sections are arranged on one straight line. To be more specific, one straight line that at least transverses two pads and also transverses at least one circuit section can be drawn. Alternatively, one straight line that at least transverses one pad and also transverses at least two circuit sections can be drawn. Also, as illustrated in FIG. 7, the length in the second direction orthogonal to the first direction of the circuit section where the TG 705 is arranged is shorter than the length in the second direction of the pad. The same applies to the control circuit 706 and the other circuit 707.

The signal wiring 701 is electrically connected to the TG 705 and the respective circuits. As described above, since the plurality of circuits are arranged along the first direction, the signal wiring 701 is arranged along the first direction as a whole. The signal wiring 701a is overlapped with the pad 702a. The signal wiring 701b is overlapped with the pad 702b. Also, the signal wiring 701c is arranged without being overlapped with any of the pads. Instead, the signal wiring 701c may be overlapped with the power supply wiring 703. It is noted that according to the present embodiment, the signal wiring electrically connected to the signal pad 702b is overlapped with the pad 702c. A cross sectional structure of a part where the signal wiring 701 is overlapped with the plurality of pads 702a to 702d may be similar to the structure illustrated in FIG. 3.

According to the present embodiment, the circuit is arranged between two pads. For example, the TG 705 is arranged between the pad 702a and the pad 702b. For that reason, the power supply wiring 703 is arranged on a side far from the pixels of the plurality of pads 702a to 702d. Then, the GND wiring 704 is arranged on a side close to the plurality of pads 702a to 702d. To elaborate, the power supply wiring 703 for supplying the power supply voltage to the TG 705 and the GND wiring 704 for supplying the GND voltage are arranged on opposite directions. The layout is not limited to the above-described layout and may be a layout in which the power supply voltage and the GND voltage are supplied from one of the sides. In this case, one of the power supply wiring and the GND wiring may be connected to a relay wiring on a lower layer for intersecting the other wiring.

In either case, one of the power supply wiring and the GND wiring may be arranged next to the plurality of pads 702a to 702d. Like the signal wiring 701c, while the signal wiring 701 is overlapped with the power supply wiring 703, it is possible to reduce the chip area. However, if the circuit scale of the signal processing circuit is increased, the number of the signal wirings 701 is increased, and it becomes difficult to arrange all the signal wirings 701 under the power supply wiring 703.

According to the present embodiment, a part of the conductive member constituting the signal wiring 701 is overlapped with at least a part of the pads. According to this, for example, it is not necessary to provide the area where only the conductive member constituting the signal wiring 701 is arranged between the conductive member constituting the power supply wiring 703 and the plurality of pads 702a to 702d. Therefore, it is possible to reduce the chip area.

According to the present embodiment, the plurality of pads 702a to 702d and the plurality of circuit blocks 705 to 707 are arranged on the one straight line along the first direction where the plurality of pixels 104 area arranged. According to this, it is possible to shorten the length in the direction intersecting the first direction. Therefore, it is possible to further reduce the chip area.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-283771 filed Dec. 20, 2010, which is hereby incorporated by reference herein in its entirety.

What is claimed is:

1. A semiconductor apparatus comprising:
a semiconductor chip;
a plurality of pads including an input pad and an output pad;
a first circuit section;
a second circuit section;
a wiring for electrically connecting the first circuit section and the second circuit section; and
a buffer, wherein:
the first circuit section and the second circuit section are arranged in an inner area of the semiconductor chip with respect to the plurality of pads,
the wiring is composed of a conductive member,
at least a part of the conductive member is overlapped with at least one pad of the plurality of pads,
the conductive member includes a first conductive member, a second conductive member, and a third conductive member,
the first conductive member is overlapped in a planar view with the at least one pad,
the second conductive member electrically connects the first conductive member and the first circuit section,
the third conductive member electrically connects the first conductive member and the second circuit section,
the first conductive member is arranged in a wiring layer different from the second conductive member and the third conductive member, and
the buffer is arranged in an intermediate wiring layer between the first conductive member and the at least one pad and is arranged so as to be overlapped in a planar view with the first conductive member.

2. The semiconductor apparatus according to claim 1, further comprising:
a plurality of photoelectric conversion sections, wherein:
the plurality of pads are arranged along a first direction;
the plurality of photoelectric conversion sections are arranged along the first direction in parallel with the plurality of pads;
the first circuit section and the second circuit section constitute a processing circuit for processing signals from the plurality of photoelectric conversion sections; and
the wiring transmits the signals or a drive signal for driving the processing circuit.

3. The semiconductor apparatus according to claim 2, wherein:
the plurality of pads, the first circuit section, and the second circuit section are arranged in line along the first direction; and
the at least one pad is arranged between the first circuit section and the second circuit section.

4. The semiconductor apparatus according to claim 2, wherein:
the first circuit section and the second circuit section are arranged along the first direction; and the first circuit section and the second circuit section are arranged between the plurality of pads and the plurality of photoelectric conversion sections.

5. The semiconductor apparatus according to claim 2, wherein:
the second circuit section is arranged between the first circuit section and the plurality of photoelectric conversion sections; and
a length along the first direction of a region where the second circuit section is arranged is longer than a length along the first direction of a region where the first circuit section is arranged.

6. The semiconductor apparatus according to claim 2, wherein:
the first circuit section is configured to generate a clock signal; and
the wiring transmits the clock signal.

7. The semiconductor apparatus according to claim 2, further comprising:
a power supply wiring, wherein:
the power supply wiring is composed of a fourth conductive member;
the plurality of pads include a power supply pad electrically connected to the fourth conductive member; and
the fourth conductive member is arranged in a same layer as the plurality of pads and is arranged so as not to be overlapped in a planar view with the plurality of pads.

8. The semiconductor apparatus according to claim 7, wherein:
the plurality of pads and the fourth conductive member are arranged in a first wiring layer,
the second conductive member and the third conductive member are arranged in a second wiring layer, and
the buffer is formed of a same material as the second conductive member and the third conductive member and is arranged in the second wiring layer.

9. The semiconductor apparatus according to claim 8, wherein the first wiring layer is an uppermost wiring layer, and a thickness of the pad arranged in the first wiring layer is larger than a thickness of the second conductive member, the third conductive member, or the buffer arranged in the second wiring layer.

10. The semiconductor apparatus according to claim 2, wherein:
the first circuit section or the second circuit section includes a MOS transistor; and
a gate electrode of the MOS transistor and the part, overlapped with the at least one pad, of the conductive member constituting the wiring are arranged in a same wiring layer.

11. The semiconductor apparatus according to claim 2, wherein:
the first circuit section or the second circuit section includes a MOS transistor; and
a gate electrode of the MOS transistor and the part, overlapped with the at least one pad, of the conductive member constituting the wiring are formed of a same material.

12. The semiconductor apparatus according to claim 2, wherein a width of the part, overlapped with the at least one pad, of the conductive member constituting the wiring is larger than a width of a part different from the part, overlapped with the at least one pad, of the conductive member.

13. The semiconductor apparatus according to claim 2, wherein a time period in which a voltage supplied to the at least one pad changes and a time period in which a voltage supplied to the wiring are different time periods.

14. The semiconductor apparatus according to claim 1, wherein the first conductive member is arranged in a lower layer than the second conductive member and the third conductive member.

15. The semiconductor apparatus according to claim 1, wherein the buffer is arranged in a same layer as the second conductive member and the third conductive member.

16. The semiconductor apparatus according to claim 1, wherein the buffer is formed of a conductive material and is electrically floating.

17. A semiconductor apparatus comprising:
a semiconductor chip;
a plurality of pad including an input pad and an output pad;
a circuit section;
a wiring for electrically connecting a first pad of the plurality of pads and the circuit section; and
a buffer, wherein:
the circuit section is arranged in an inner area of the semiconductor chip with respect to the plurality of pads,
the wiring is composed of a conductive member,
a part of the conductive member is overlapped with a second pad of the plurality of pads,
the conductive member includes a first conductive member, a second conductive member, a third conductive member,
the first conductive member is overlapped in a planar view with the second pad,
the second conductive member electrically connects the first conductive member and the circuit section,
the third conductive member electrically connects the first conductive member and the first pad,
the first conductive member is arranged in a wiring layer different from the second conductive member and the third conductive member, and
the buffer is arranged in an intermediate wiring layer between the first conductive member and the second pad and is arranged so as to be overlapped in a planar view with the first conductive member.

18. The semiconductor apparatus according to claim 17, further comprising:
a plurality of photoelectric conversion sections, wherein:
the plurality of pads are arranged along a first direction,
the plurality of photoelectric conversion sections are arranged along the first direction in parallel with the plurality of pads,
the circuit section constitutes a processing circuit for processing signals from the plurality of photoelectric conversion sections, and
the wiring transmits the signals or a drive signal for driving the processing circuit.

19. The semiconductor apparatus according to claim 18, further comprising:
a power supply wiring, wherein:
the power supply wiring is composed of a fourth conductive member;
the plurality of pads includes a power supply pad electrically connected to the fourth conductive member; and
the fourth conductive member is arranged in a same layer as the plurality of pads and also the fourth conductive member is arranged so as not to be overlapped in a planar view with the plurality of pads.

20. The semiconductor apparatus according to claim 19, wherein:
the plurality of pads and the fourth conductive member are arranged in a first wiring layer;
the second conductive member and the third conductive member are arranged in a second wiring layer, and the buffer is formed of a same material as the second conductive member and the third conductive member and is arranged in the second wiring layer.

21. The semiconductor apparatus according to claim 20, wherein the first wiring layer is an uppermost wiring layer, and a thickness of the pad arranged in the first wiring layer is larger than a thickness of the second conductive member, the third conductive member, or the buffer arranged in the second wiring layer.

22. The semiconductor apparatus according to claim 18, wherein:
the circuit section includes a MOS transistor; and
a gate electrode of the MOS transistor and the part, overlapped with the at least one pad, of the conductive member constituting the wiring are arranged in a same wiring layer.

23. The semiconductor apparatus according to claim 18, wherein:
the circuit section includes a MOS transistor; and
a gate electrode of the MOS transistor and the part, overlapped with the at least one pad, of the conductive member constituting the wiring are formed of a same material.

24. The semiconductor apparatus according to claim 18, wherein a width of the part, overlapped with the at least one pad, of the conductive member constituting the wiring is larger than a width of a part different from the part of the conductive member.

25. The semiconductor apparatus according to claim 18, wherein a time period in which a voltage supplied to the at least one pad changes and a time period in which a voltage supplied to the wiring change are different time periods.

26. The semiconductor apparatus according to claim 17, wherein the first conductive member is arranged in a lower layer than the second conductive member and the third conductive member.

27. The semiconductor apparatus according to claim 17, wherein the buffer is arranged in a same layer as the second conductive member and the third conductive member.

28. The semiconductor apparatus according to claim 17, wherein the buffer is formed of a conductive material and is electrically floating.

29. A semiconductor apparatus comprising:
a semiconductor chip;
a plurality of pads including an input pad and an output pad;
a first circuit section;
a second circuit section; and
a wiring for electrically connecting the first circuit section and the second circuit section,
wherein:
the first circuit section and the second circuit section are arranged in an inner area of the semiconductor chip with respect to the plurality of pads,
the wiring is composed of a conductive member,
at least a part of the conductive member is overlapped with at least one pad of the plurality of pads,
the conductive member includes a first conductive member, a second conductive member, and a third conductive member,
the first conductive member is overlapped in a planar view with the at least one pad,
the second conductive member electrically connects the first conductive member and the first circuit section,
the third conductive member electrically connects the first conductive member and the second circuit section, and
the first conductive member is arranged in a wiring layer lower than the second conductive member and the third conductive member.

* * * * *